United States Patent
Freestone et al.

(10) Patent No.: US 10,055,316 B2
(45) Date of Patent: Aug. 21, 2018

(54) ROW DRIVER FAULT ISOLATION CIRCUITRY FOR MATRIX TYPE INTEGRATED CIRCUIT

(71) Applicant: VAREX IMAGING CORPORATION, Salt Lake City, UT (US)

(72) Inventors: Steven Freestone, Kaysville, UT (US); Pieter Gerhard Roos, Sandy, UT (US)

(73) Assignee: VAREX IMAGING CORPORATION, Salt Lake City, UT (US)

( * ) Notice: Subject to any disclaimer, the term of this patent is extended or adjusted under 35 U.S.C. 154(b) by 30 days.

(21) Appl. No.: 15/418,721

(22) Filed: Jan. 28, 2017

(65) Prior Publication Data

US 2017/0223283 A1 Aug. 3, 2017

Related U.S. Application Data

(60) Provisional application No. 62/288,431, filed on Jan. 29, 2016.

(51) Int. Cl.
| | |
|---|---|
| G06F 11/18 | (2006.01) |
| H04N 5/345 | (2011.01) |
| H01L 27/118 | (2006.01) |
| H01L 27/146 | (2006.01) |
| H04N 5/32 | (2006.01) |
| H04N 5/374 | (2011.01) |
| G01T 1/20 | (2006.01) |
| G01T 1/24 | (2006.01) |

(52) U.S. Cl.
CPC ...... *G06F 11/183* (2013.01); *H01L 27/11807* (2013.01); *H01L 27/14603* (2013.01); *H01L 27/14658* (2013.01); *H04N 5/32* (2013.01); *H04N 5/3452* (2013.01); *H04N 5/374* (2013.01); *G01T 1/2018* (2013.01); *G01T 1/247* (2013.01); *H01L 2027/11875* (2013.01)

(58) Field of Classification Search
CPC ............................. G06F 11/183; G06F 11/187
See application file for complete search history.

(56) References Cited

U.S. PATENT DOCUMENTS 4,583,224 A * 4/1986 Ishii .................. G05B 9/03
714/10
4,873,685 A * 10/1989 Millis, Jr. .......... G06F 11/187
714/703

(Continued)

*Primary Examiner* — Steve Nguyen
(74) *Attorney, Agent, or Firm* — David G. Wilding

(57) ABSTRACT

Technology is described for generating a valid token control signal from control signals from a row driver. In one example, a matrix type integrated circuit includes a row driver module and a 2D array of cell elements. The row driver module includes a voting logic module and at least two row drivers configured to generate control signals on at least two communal lines for cell elements of a row of the 2D array. Each row driver is configured to generate control signals on at least three control lines where at least two control lines are the communal lines and coupled to a corresponding communal line of another row driver. The voting logic module is coupled to the at least three control lines of one of the row drivers and configured to generate an output based on the control signals on the at least three control lines.

20 Claims, 16 Drawing Sheets

(56) References Cited

U.S. PATENT DOCUMENTS

| | | | | |
|---|---|---|---|---|
| 4,979,136 | A | * | 12/1990 | Weiman ................... G06T 5/20 348/606 |
| 5,208,782 | A | * | 5/1993 | Sakuta .................. G11C 11/406 257/784 |
| 5,886,353 | A | | 3/1999 | Spivey et al. |
| 5,942,779 | A | * | 8/1999 | Okita ..................... G11C 17/14 257/315 |
| 7,958,394 | B1 | * | 6/2011 | Bridgford ........... G06F 11/2215 714/11 |
| 2006/0227596 | A1 | * | 10/2006 | Thayer ................... G11C 5/005 365/154 |
| 2008/0184057 | A1 | * | 7/2008 | Thorp ................... G06F 11/183 714/1 |
| 2008/0239809 | A1 | * | 10/2008 | Chae .................. G11C 11/5621 365/185.09 |
| 2009/0274245 | A1 | * | 11/2009 | Brown ................. G11C 7/1006 375/340 |
| 2010/0094579 | A1 | * | 4/2010 | Scheffer ................... H04N 5/32 702/85 |
| 2010/0220517 | A1 | * | 9/2010 | Okayama ............... G11C 7/20 365/158 |
| 2013/0093910 | A1 | | 4/2013 | Lee et al. |

* cited by examiner

US 10,055,316 B2

ROW DRIVER FAULT ISOLATION CIRCUITRY FOR MATRIX TYPE INTEGRATED CIRCUIT

BACKGROUND

Unless otherwise indicated herein, the approaches described in this section are not prior art to the claims in this disclosure and are not admitted to be prior art by inclusion in this section.

Typically, an image sensor includes an array of pixel elements fabricated as an integrated circuit (IC) on a semiconductor substrate, such as silicon wafer. Very-large-scale integration (VLSI) is the process of creating an IC by combining thousands of transistors and other circuit elements into a single chip or die. The wafer serves as the substrate for microelectronic devices (e.g., image sensors) built in and over the wafer and undergoes many microfabrication process steps such as doping or ion implantation, etching, deposition of various materials, and photolithographic patterning. After the wafer is processed, the individual microcircuits or dies are separated (e.g., using wafer dicing) and packaged. The semiconductor wafer can include a number of dies. For example, a 300 millimeter (mm) (130) wafer (100) (i.e., 11.811 inches ["] or approximately [~] 12") can include 148-20 mm (132) square dies (110), as shown in FIG. 1. Dies typically refer to ICs prior to being packaged and encased in a supporting case (e.g., plastic) that prevents physical damage and corrosion. Chips typically refer to ICs after being packaged (or assembled) that include electrical leads that allow the ICs to be coupled to other electronic components.

A conventional image sensor has a relatively small die size (e.g., less than [<] 5×5 centimeters [cm]) and includes a two dimensional (2D) array of sensor elements (or pixels) that perform a similar function. Very large area complementary metal-oxide-semiconductor (CMOS) image sensors (e.g., greater than or equal to [≥] 5×5 cm) can provide improved imaging performance over conventional image sensor for some scenarios, such as medical imaging (e.g., x-ray imaging), as well as in other high end imaging applications in astronomy, cinematography, and other scientific imaging. The very large area CMOS image sensors are at least an order of magnitude (10×) larger than devices for which conventional CMOS imager manufacturing processes have been developed. CMOS imager manufacturing processes often rely on know-how developed for silicon wafer based semiconductor chip manufacturing, where rectangular dies used in chips are conventionally in the 1 to 25 mm size range. Thus, very large area CMOS image sensors are well outside the chip size range conventionally used by the semiconductor manufacturing technology field. The technology (circuitry, devices, and methods) described herein provides improvements in very large area CMOS image sensor circuit designs as well as conventional image sensors.

DETAILED DESCRIPTION OF SOME EXAMPLE EMBODIMENTS

Figure 1:
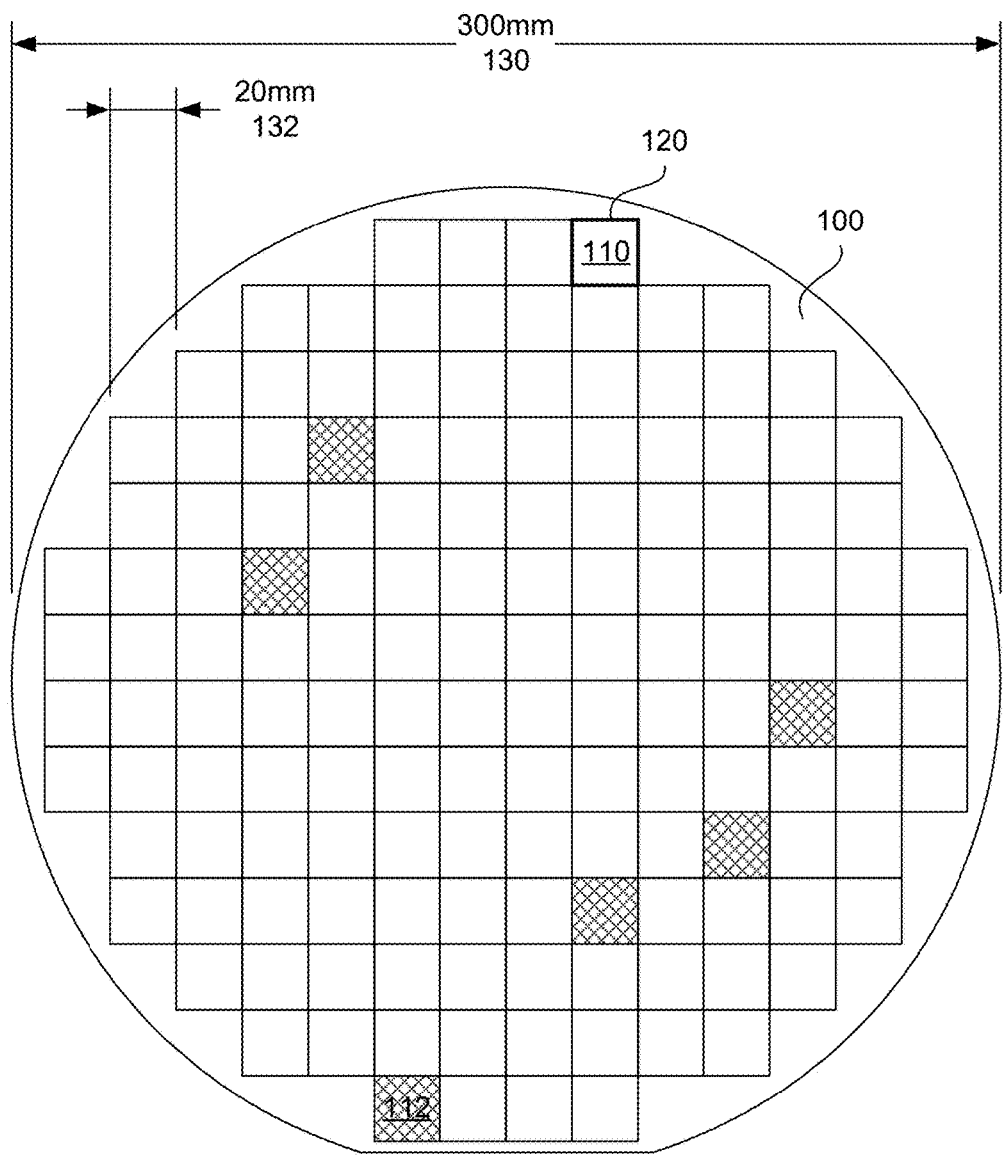
FIG. 1 illustrates a block diagram of an example 300 mm semiconductor wafer including a number of 20 mm square dies.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Numbers provided in flow charts and processes are provided for clarity in illustrating steps and operations and do not necessarily indicate a particular order or sequence. Unless otherwise defined, the term "or" can refer to a choice of alternatives (e.g., a disjunction operator, or an exclusive or) or a combination of the alternatives (e.g., a conjunction operator, and/or, a logical or, or a Boolean OR).

Disclosed embodiments relate generally to very large area complementary metal-oxide-semiconductor (CMOS) matrix type integrated circuits and, more particularly, to distributing power, control, and reference signals and methods for detecting faults in the matrix type integrated circuit and disabling these distributed signals. Technology is described for generating a valid token control signal from control signals on at least three control lines of a row driver in a matrix type integrated circuit or valid control signals on communal lines of the row driver.

CMOS is a technology for constructing integrated circuits (ICs) that uses complementary and symmetrical pairs of p-type and n-type metal oxide semiconductor field effect transistors (MOSFETs) for logic functions. CMOS devices do not consume as much energy (e.g., produce as much waste heat) as other forms of logic, for example transistor-transistor logic (TTL) or N-type metal-oxide-semiconductor (NMOS) logic, which normally have some standing current even when the device is not changing state.

In standard manufacturing processes, it is common to have a number of fatal defects per wafer due to material and process variations along with contaminants. Such defects can include semiconductor crystal defects causing faulty devices or short circuits between metal conductors. The some defects may render the chip candidates defective or non-conforming, which are typically considered acceptable, because each wafer contains a large number of chip candidates and the loss of a few of these candidates, due to defects, is minimal and factored into the yield and cost of fabricating conforming chips. The yield refers to the number of conforming chips divided by the total number of candidate chips.

This number of fatal defects (i.e., causing non-conforming chips) however not acceptable for very large sensors (e.g., ≥5×5 cm), where a wafer may contain only one or very few individual candidate chips. For example, a single short circuit (e.g. between two power supply conductors) on a wafer with only one candidate chip may render the whole wafer as scrap. In another example, with only one candidate chip, a defect in a driver (e.g., row driver) coupled in a daisy chain with other drivers where the coupling provides a token that passes control to other drivers may also render the whole wafer as scrap. As a result, a near zero yield of conforming chips may be a likely outcome using conventional semiconductor manufacturing processes and designs.

Components can be added to circuitry or steps taken to reduce the number of wafer defects causing fatal device failures. For example, in one embodiment, a matrix type integrated circuit includes a row driver module and a two dimensional (2D) array of cell elements arranged in vertical columns and horizontal rows. Each cell element in the 2D array provides a similar function (e.g., pixel detector element, pixel image element, pixel display element, or memory element). The row driver module includes at least two row drivers and a voting logic module. The at least two row drivers are configured to generate control signals on at least two communal lines for cell elements of at least one row of the 2D array, wherein each row driver is configured to generate control signals on at least three control lines, and at least two control lines of the at least two row drivers are the communal lines, and each communal line is coupled to a corresponding communal line of another row driver of the at least two row drivers. The voting logic module coupled to the at least three control lines of one of the row drivers and configured to generate an output based on the control signals on the at least three control lines.

The description below provides additional details and examples. FIG. 1 illustrates an example semiconductor wafer 100 with a 300 mm diameter 130. Wafers can have various diameters, such as 300 mm, 200 mm, 150 mm, 125 mm, and 100 mm. The maximum number of dies a wafer can generate depends on the wafer diameter and the dimensions of the dies. For example, a 300 mm wafer 100 can generate 148-20 mm square dies 110. Conventionally, each die is designed to operate as a separate functional circuit that may be individually package or coupled to other electrical components and circuits. As discussed previously, due to inherent material and process variations along with contaminants all the fabricated dies or chip candidates do not typically result in functional or conforming circuits. A few chip candidates can have defects that are severe enough that the circuit of those chips will not perform within the chip's requirements (e.g., maximum allowed current) and may even affect other areas of the chip or coupled circuits. A fatal defect is a defect that results in a chip that does not perform within the chip's requirements, referred to as a non-conforming chip or die 112. FIG. 1 illustrates a wafer with 6 non-conforming dies 112.

Conventionally, the process of fabricating integrated circuits on dies involves using photolithography to transfer a geometric pattern from a photomask or reticle to a light-sensitive chemical photoresist (or simply resist) on a substrate (e.g., wafer). The photomask or reticle is an opaque plate with holes or transparencies that allow light to shine through in a defined pattern. A series of different reticles along with doping, ion implantation, etching, and deposition may be used to fabricate the integrated circuits. The feature size of the integrated circuits is typically determined by the reticle, light wavelength of the light source for the reticle, photoresist, time of exposure, and etching processes. Some reticles can be used to fabricate features that are less than 50 nm. Conventionally, reticles are smaller than wafers. For example, a wafer 100 can have a 300 mm diameter and a reticle area 120 that is 20×20 mm, as shown in FIG. 1. Current technology for producing relatively small features (<200 nm width) has reticle dimensions up to 50 mm (e.g., 40×40 mm). A stepper is used to duplicate the image of the reticle over the entire wafer. The stepper is a device used in the manufacture of ICs that is similar in operation to a slide projector or a photographic enlarger. The die can be smaller, a similar size, or larger than the reticle area. FIG. 1 illustrates a reticle area 120 with a similar size to a die 110. Although dies and reticles are shown as squares for simplicity of illustration, the dies and reticles can also be rectangular or any geometric shape. Reticles are typically rectangular to maximize the area of the wafer.

Figure 2:
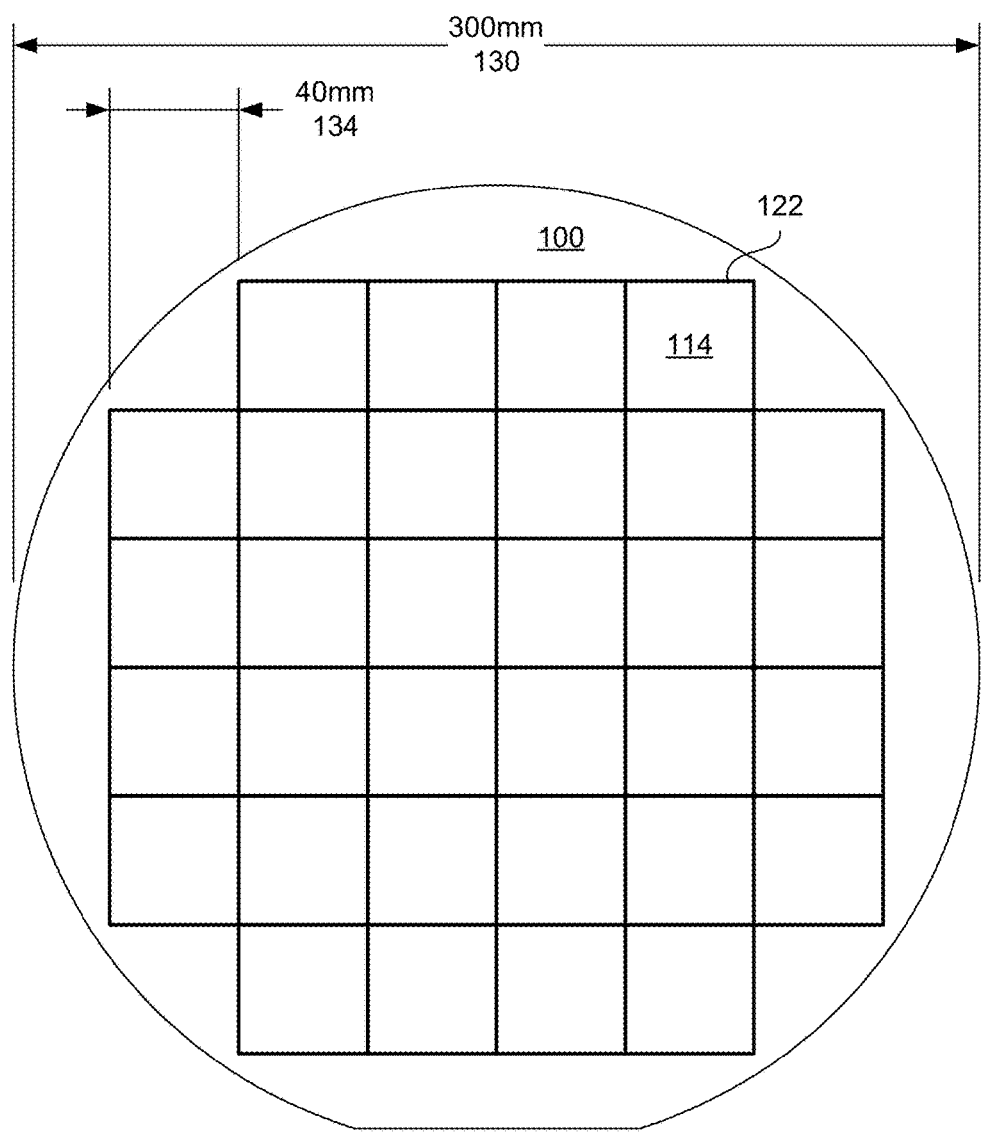
FIG. 2 illustrates a block diagram of an example 300 mm semiconductor wafer including a number of 40 mm square dies.
Figure 3:
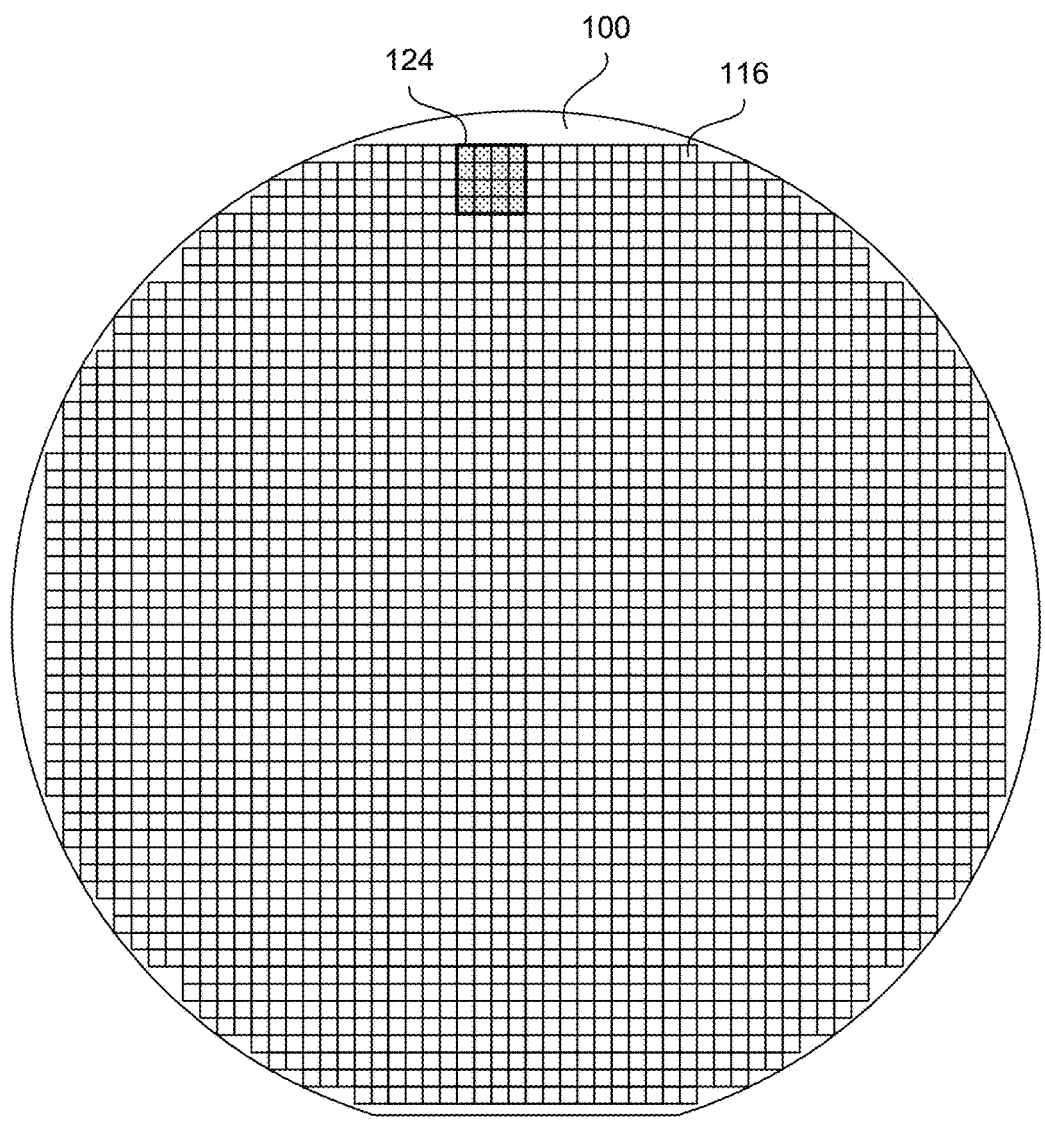
FIG. 3 illustrates a block diagram of an example 300 mm semiconductor wafer including a 5 mm square dies using a 20 mm square reticle.

FIG. 2 illustrates an example semiconductor wafer 100 with a 300 mm diameter 130 and 32-40 mm 134 square dies 114. The reticle area 122 has a similar size to a die 114. FIG. 3 illustrates an example semiconductor wafer 100 with a 300 mm diameter and multiple 5 mm square dies 116. The reticle area 124 is larger than the dies 116. In FIG. 3, the 20×20 mm reticles are used to fabricate 16-5×5 mm dies 116 per reticle area.

Figure 4:
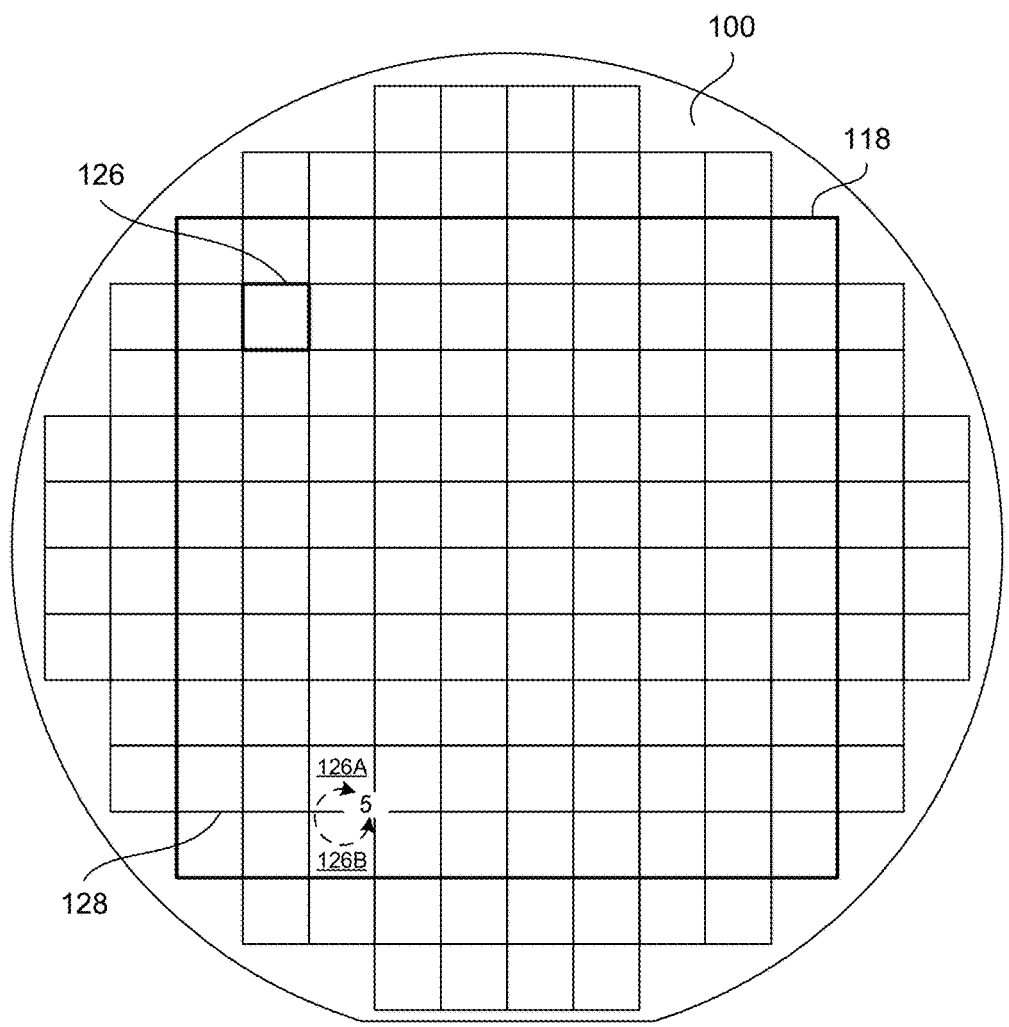
FIG. 4 illustrates a block diagram of an example 300 mm semiconductor wafer including a 200 mm square die using a 20 mm square reticle.

FIG. 4 illustrates an example semiconductor wafer 100 with a 300 mm diameter and a single 200 mm square die 118. The reticle area 126 is smaller than the die 118. When the die is a similar size or smaller than the reticle area, the reticle boundary 128 between reticle areas is typically cut during wafer dicing using a saw or a laser or otherwise unused in circuit functionality and operation. When the reticle area 126 is smaller than the die 118, electrical conductors (e.g., aluminum, gold, copper, or poly silicon) or traces can extend across the reticle boundary 128 and can be used to connect circuit features from one reticle area to another reticle area. As used herein, a trace (or line) is an electrical conductor used to connect circuit elements (e.g., transistors, diodes, capacitors, resistors, and inductors) or cells of an integrated circuit together. A cell is a circuit or module with circuit elements that is duplicated in various areas of an IC. In addition to defects caused by material and process variations occurring within the reticle area, defects can also occur on the reticle boundaries 128, such as over exposure or under exposure of photoresist on the edges resulting in over etching or under etching (or over doping or under doping) causing opens and shorts. A short or short circuit is accidental or unintended connection between two nodes of an electrical circuit, which can cause excessive current to flow through the unintended connection. An open or open circuit is infinite resistance between two nodes, which can electrically disconnect circuit elements that would otherwise be connected.

The various defects that can occur in very large area integrated circuits (e.g., dies larger than the reticle area) or wafer-scale integration (WSI) can create near zero yield or unacceptable yield of conforming chips. Wafer-scale integration is a very-large integrated circuit that uses an entire semiconductor wafer (e.g., silicon wafer) to produce a single super-chip. Throughout this disclosure, reference is made to very large area CMOS image sensors; the technology (e.g., circuitry, devices, and methods) and solutions disclosed may also apply to conventional image sensors, x-ray image sensors, displays, memory arrays, and any other matrix type integrated circuit.

Conforming very large area integrated circuits, such as very large area CMOS image sensors used in medical imaging (e.g., x-ray imaging), astronomy, cinematography, scientific imaging, and other high end imaging applications, can have improved imaging performance over smaller image sensors (i.e., smaller than 50×50 mm image sensors). Conventional image sensors and very large area ICs are matrix type integrated circuits that include a two dimensional (2D) array of image or pixel cell elements. Each of these image cell elements performs a similar function of detecting photons (e.g., light or x-ray photons) and converting the photons in a specified location to an electrical charge or current. The pattern of detected photons and areas with no detected photons on the array is used to generate an image. The electrical components of the image cell elements can have similar electrical connections to vertical (y-axis) and horizontal (x-axis) electrical traces that extend in columns and rows, respectively. The vertical traces (e.g., column traces) in columns and horizontal traces (e.g., row traces) in rows can be used to distribute power, control signals, and reference signals to the image cell elements as well as receive outputs from the image cell elements. Vertical, columns, horizontal, and rows are relative references to the large plane of the semiconductor substrate. Throughout this disclosure reference is made to vertical traces or columns; the vertical trace features may also apply to horizontal traces and the columns features may also apply to rows, if the orientation of the substrate is rotated 90 degrees. Vertical traces and columns are used for ease of explanation of the features.

The vertical and horizontal traces can extend to the signal distribution and signal processing circuitry or networks shared by the cell elements at the edge or periphery of the array. As used herein, signal distribution circuitry or signal processing circuitry shared by a plurality of cell elements at the edge or periphery of the array is referred to as communal circuitry or a communal module. The communal module can provide power, control signals, and reference signals inputs to the cell elements. In addition, the communal circuitry or the communal module may also provide signal processing of outputs from the cell elements. Power refers to an electrical voltage potential and associated current used to activate transistors and other electric components in the cell elements, such as $V_{DD}$ or $V_{CC}$ (positive voltage potential), ground or GND (near zero voltage potential, approximately [~] 0 volts [V], or voltage potential reference), and $V_{SS}$ (negative voltage potential). For many digital circuits, such as image sensors, the nominal supply voltage or positive voltage ($V_{DD}$ or $V_{CC}$) can be 1.8V, 2.4V, 3.3V, or 5.0V. As used herein, a control signal refers to digital signals used to control the function of the cell element. A digital signal is a signal that represents, a sequence of discrete values, such as a logic signal with two possible values—a logic "1" or high voltage potential (e.g., $V_{DD}/2$ to $V_{DD}$ or $[V_{CC}-\text{Threshold}_{High}$ value] to $V_{CC}$) and a logic "0" or low voltage potential (e.g., ~0V to $V_{DD}/2$, ~0V to $[0V+\text{Threshold}_{Low}$ value], or $V_{SS}/2$ to $V_{SS}$). As used herein, a reference signal refers to an analog signal. An analog signal is a continuous signal for which a time varying feature (variable) of the signal is a representation of some other time varying quantity. Although, in some scenarios control signal can include analog signals or reference signals can include digital signals, for the consistency of terminology and ease of explanation in this disclosure, a control signal is a digital signal and a reference signal is an analog signal.

The communal module can be located on any of the four edges of the 2D array, such as all four edges, three edges, two edges, or only one edge. The conductive traces in one of the axes (e.g., y-axis) can extend to the edge or periphery of the array. In the case of very large area integrated circuits (e.g., very large area CMOS image sensors) the conductive traces extend over multiple reticle areas and crosses at least one reticle boundary. For example, functioning conductive traces along one axis can be greater than 50 mm.

Figure 5:
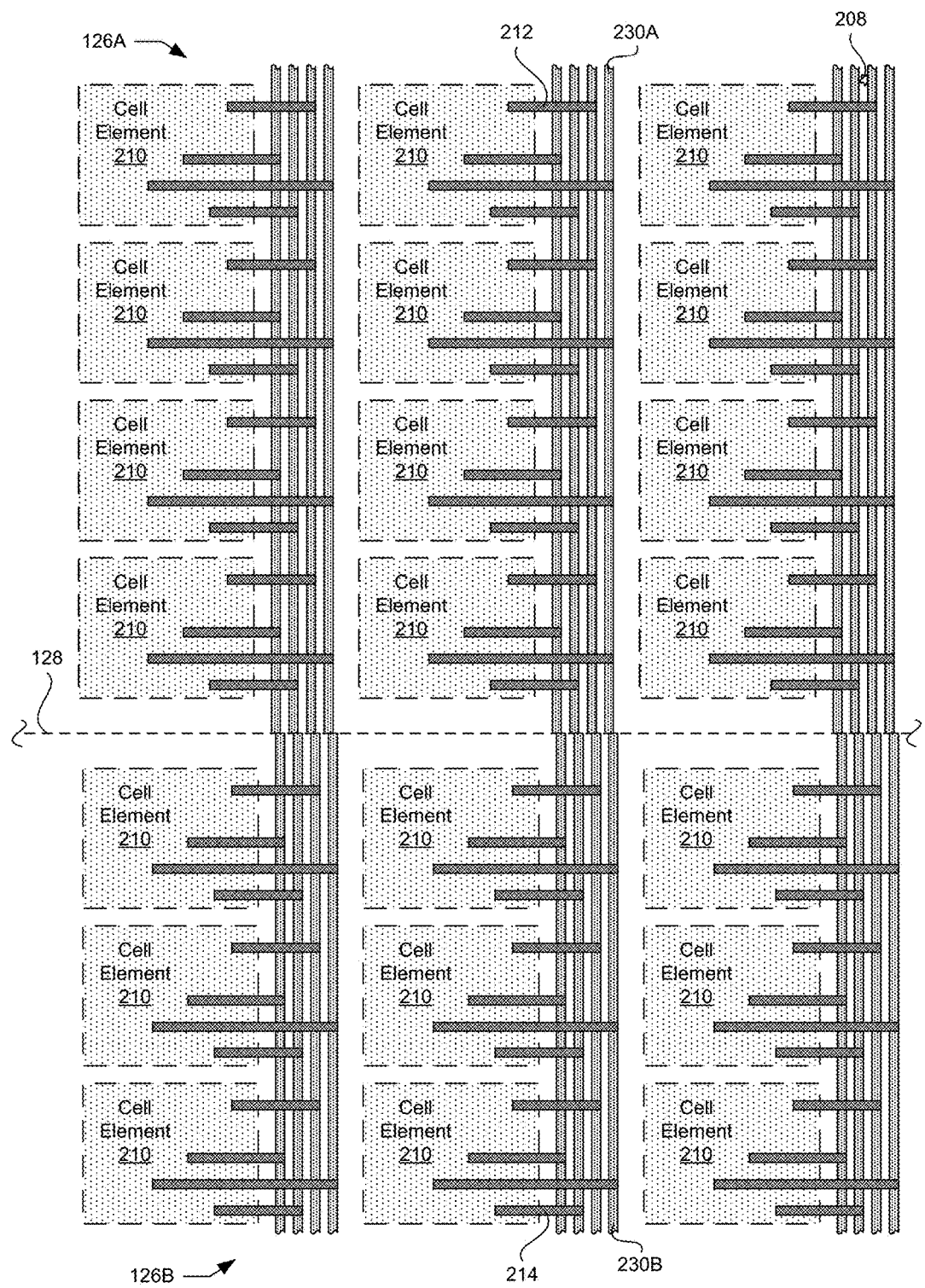
FIG. 5 illustrates an expanded view of an example reticle boundary.

FIG. 5 illustrates an expanded view of matrix type integrate circuit at a reticle boundary 128 of a 2D array of cell elements 210. Each cell element 210 has at least one conductive interconnect 212 that electrically couples each cell element 210 to the vertical conductive traces 230A and 230B. Typically, the alignment of features within a reticle area can be more precise than the alignment of features between reticle areas (i.e., between two reticles 126A and 126B). Reticles within a reticle area can be optically aligned with each other, while adjacent reticles are aligned with each other via a mechanical stepper. FIG. 5 illustrates a slight misalignment that can occur between the vertical conductive traces 230A of a first reticle area 126A and the vertical conductive traces 230B of a second reticle area 126B, which may also increase the likelihood of defects on the reticle boundary. A defect 208 (e.g., material or process variation or contaminant) is illustrated between two vertical conductive traces 230A that can cause a short between the conductive traces 230A.

As discussed previously, defects can have a variety of causes, such as semiconductor crystal defects causing faulty cell elements or short circuits between conductive traces. Defects may also occur in drive circuitry (e.g., row driver) that can block signals from propagating in subsequent drivers that have inputs that use outputs from prior drivers, which can cause erroneous operation of the drive circuitry. Any one of these defects can be fatal and cause the die to be non-conforming, which can result in lowering the yields, which can be especially problematic for wafers with a single die or very few dies, such as very large area integrated circuits.

A technique to achieve a type of yield enhancement includes the use of redundant parallel processing of signals with voting schemes used to ignore signals from failed paths, local current limiting to prevent short circuits from causing whole-chip failure, and external defect correction to remove defective pixels' information from images. U.S. patent application Ser. No. 15/007,312, filed Jan. 27, 2016, "Matrix Type Integrated Circuit with Fault Isolation Capability," which is incorporated by reference in its entirety, discloses example circuitry for local current limiting to prevent or reduce short circuits from causing whole-chip failure.

Figure 6:
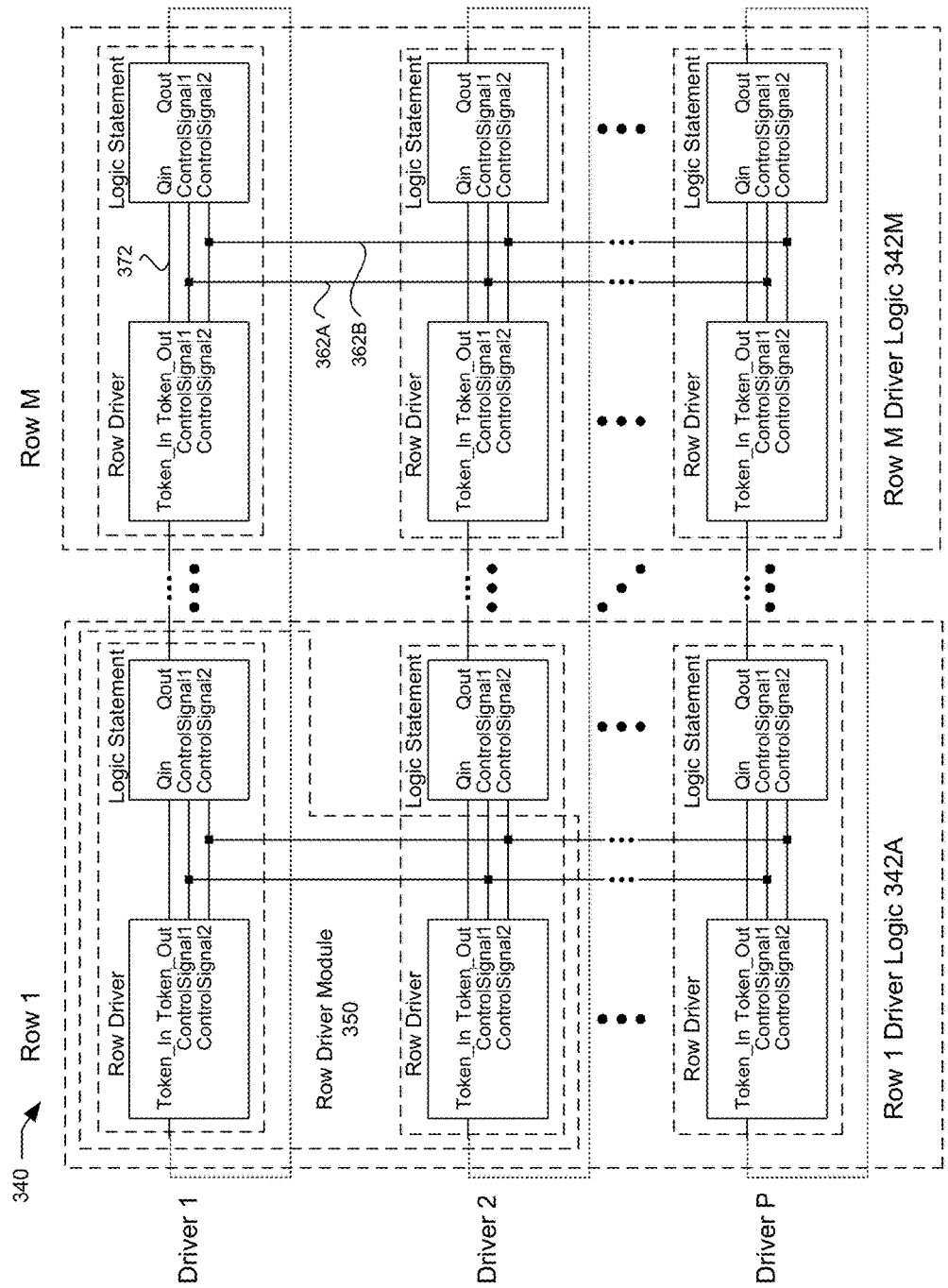
FIG. 6 illustrates a schematic diagram of an example row drive circuitry (e.g., row drivers) coupled to digital logic circuitry (e.g., logic statements).
Figure 7:
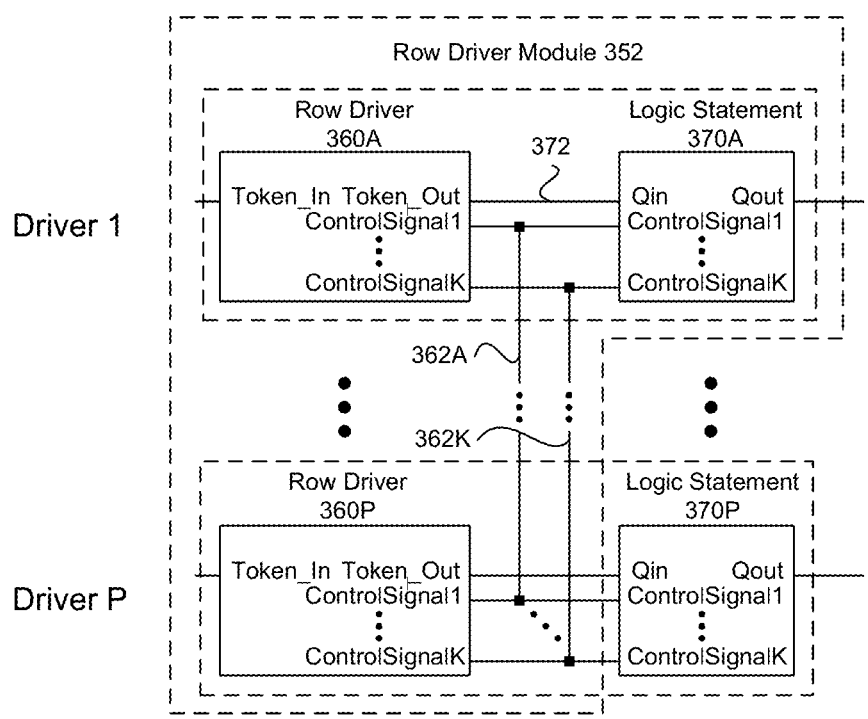
FIG. 7 illustrates a schematic diagram of an example row driver module.

FIGS. 6-7 illustrates drive circuitry that include row drivers coupled to digital logic circuitry (e.g., logic statements or voting logic modules) which can be used for redundant parallel processing of signals with voting schemes used to ignore signals from failed paths.

FIG. 6 illustrates row driver circuitry (e.g., row drivers) coupled to digital logic circuitry (e.g., logic statements). Row driver circuitry 340 includes a plurality of row drivers coupled by communal lines 362A and 362B for each row, where the row driver circuitry and logic statement for each row is referred to as row driver logic 342A and 342M. As illustrated, row drivers (drivers 1-P) and logic statements are arranged in a sequential pattern for M rows (rows 1-M) with each row driver followed by a logic statement. Two row drivers and a logic voting circuit may form a row driver module 350. Each row driver (Drivers 1-P) has an input (e.g., a token input or Token_In) and at least three outputs (e.g., token output or Token_Out, first control signal or ControlSignal1, and second control signal or ControlSignal2). The output ControlSignal1 line of each row driver (from row 1 through row M) is coupled together and coupled to the input of the logic statement (e.g., logic voting circuit). The output ControlSignal2 line of each row driver (drivers 1-P) is coupled together and coupled to the input of the logic statement (e.g., logic voting circuit). Multiple row drivers (drivers 1-P) can be used to provide a valid signal to the rows even when one of the row drivers is generates an erroneous signal. The majority of the row drivers overrides or overcomes the erroneous signal from a defective row driver. For example, if Driver 2 has defective or non-conforming circuitry (e.g., row drivers), such as coupled to a high voltage potential, the other driver circuitry (e.g., Driver 1 and Drivers 3 through Driver P) can drive correct signals to override the erroneous signal from Driver 2.

FIG. 7 illustrates a row driver module 352 with row driver 360A and 360P that has a varying number of control signal outputs (ControlSignal1-K) and logic statement 370A and 370P. In another example (not shown), the row driver may also include more than one non-communal outputs (e.g., token output). The additional control signal outputs or additional non-communal outputs of the row drivers and the additional non-communal outputs of the logic statements can add more redundancy to detect and correct errors, but may add more circuit components which can use up more of the wafer or die footprint. Row driver module 350 in FIG. 6 is similar to the row driver module 352 in FIG. 7, where the number of control signal outputs (ControlSignal1 and ControlSignal2) is two. In another example, the row drivers and logic statements in FIG. 6 can be substituted with the row drivers 360A and 360P and logic statements in 370A and 370P. For example, the row driver logic 342A and 342M can include the row drivers 360A and 360P and logic statements in 370A and 370P.

Figure 8:
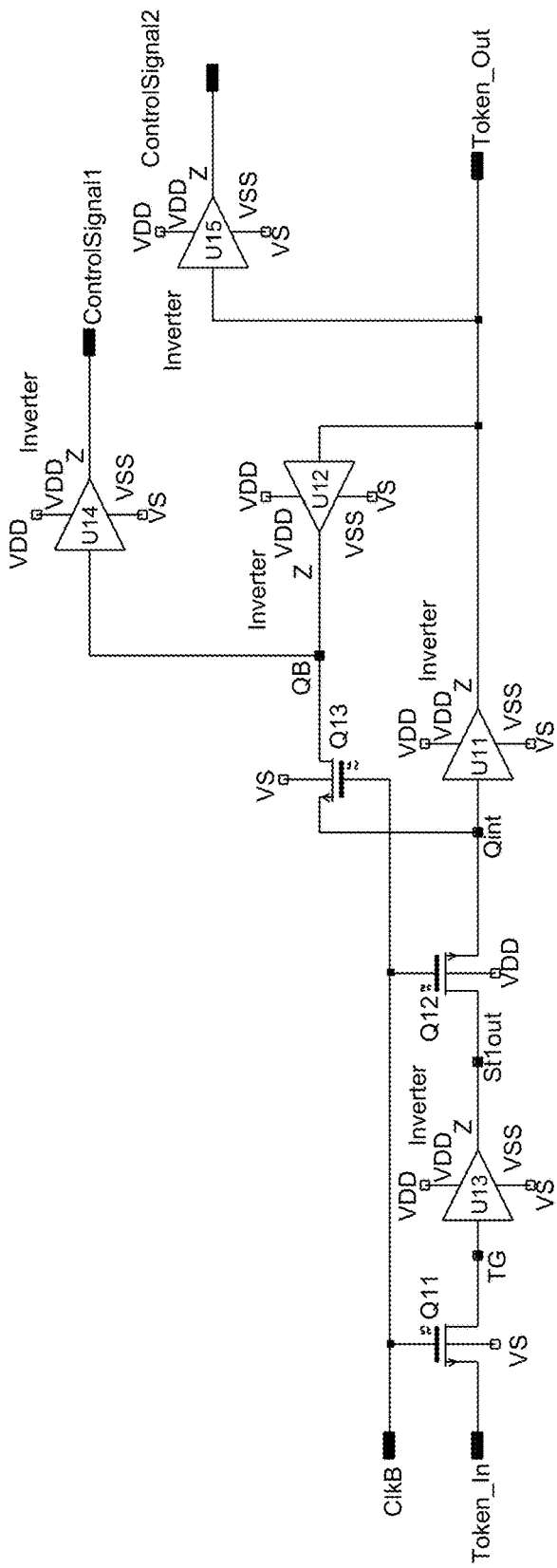
FIG. 8 illustrates a schematic diagram of an example row driver with three control line outputs (e.g., control signal 1, control signal 2, and token out).

FIG. 8 illustrates an example row driver used to provide control signals for an array of cell elements. A driver is an electrical circuit or other electronic component used to control another circuit or component (e.g., cell elements). In an array of cell elements (e.g., M×N array), a row driver provides a control signal to the cell elements in a row to readout on columns or write to the cell elements from the columns. In an imaging device with an imaging array or matrix, a row driver provides a control signal to the pixel detectors in a row to readout their value on column outputs. Control signals from row drivers sequentially traverse each row of an array until all the rows are read. Conventionally, the rows provide the control signals and columns generate the outputs for the cell elements. So, in matrix imagers (or imaging arrays) the data from each pixel is readout through the columns one row at a time.

Row drivers can be daisy chained together and pass a token (or token signal) from one row driver to the next to initiate readout of each pixel. The dependency of row drivers on each other can make the reliability of the row driver important since a corrupted token can result in a fatal device failure. A token signal is a signal used to transfer control from one module in a sequence or loop to another module in a sequence. The token signal can be used to coordinate operations between modules so operations do not interfere with each other. Conventionally, a die or chip may have less than 256 row drivers and likelihood of row driver failure is low. And when defect does occurs in a row driver, a fatal defect occurs in the candidate chip and the candidate chip is removed. When a wafer produces a large number of candidate chips (e.g, greater than 50), the number of nonconforming dies or chips due to a row driver defect may still produce an acceptable yield of conforming dies or chips. A very large area integrated circuit may have many more row drivers (e.g., exceeding 1000 row drivers). In some examples a very large area integrated circuit may have over 4000 row drivers. The larger number of row drivers increases the likelihood that a row driver will generate a fatal defect. In addition, a wafer of very large area integrated circuits may have very few candidate chips (e.g., one or four candidate chips), which have a higher value per candidate chip. The combination of a large number of row drivers and low yields due to fatal defects (e.g., row driver defects), makes row driver defects unacceptable for very large area integrated circuits. The technology (circuitry, devices, and methods) described herein provides improvements in row driver circuitry.

Referring back to FIG. 8, a row driver can include inputs (e.g., Token_In and ClkB), outputs (e.g., Token_Out, ControlSignal1, and ControlSignal2), and circuit components (e.g., CMOS transistors Q11, Q12, and Q13 [n-type MOSFETs or NMOS transistors], and inverters U11, U12, U13, U14, and U15). The row driver is activated by a clock signal (on ClkB) and a token control signal (on Token_In). The row driver shown in FIG. 8 generates a first control signal (on ControlSignal1) and a second control signal (on ControlSignal2) that is coupled to cell elements in a row. The ControlSignal1 (CS1) and ControlSignal2 (CS2) can be referred to as a communal lines because these control lines are coupled to cell elements. A communal line is a control line that is shared or coupled with more than one module (e.g., row driver, voting logic module, or cell element). In an example, a communal line is a control line that is coupled to a cell element.

The row driver shown in FIG. 8 generates a token control signal (on Token-Out) that is passed on to a next row driver in a sequence. The token signal is used to control the cell elements in a row (e.g., initiate readout of pixel detectors in a row). The Token-Out can be referred to as a non-communal line (see 372 in FIGS. 6-7) because this control line is not coupled to cell elements or because Token-Out is coupled to a single module (e.g., the next row driver). A non-communal line is a control line that is not a communal line (i.e., not coupled to a communal line). In an example, a non-communal line is a control line that couples two modules directly, such as a token line between row driver and voting logic module, or a token line between two row drivers.

FIG. 8 illustrates one example of a row driver that generates three control signals (on two communal lines and one non-communal line). In other examples (not shown), the row driver can generate at least three control signals (on a combination of communal and non-communal lines), such as three control signals (on three communal lines and one non-communal line). In FIG. 8 (in proper operation or substantially defect free), the output of ControlSignal1 and Token_Out have the same logic value and ControlSignal2 has the inverse logic value of ControlSignal1 and Token_Out (e.g., Token_Out=1, ControlSignal1=1, and ControlSignal2=0; or Token_Out=0, ControlSignal1=0, and ControlSignal2=1). If a defect occurs in the row driver, the Token_Out, ControlSignal1, and ControlSignal2 can generate invalid values, which can generate various errors.

Figure 9:
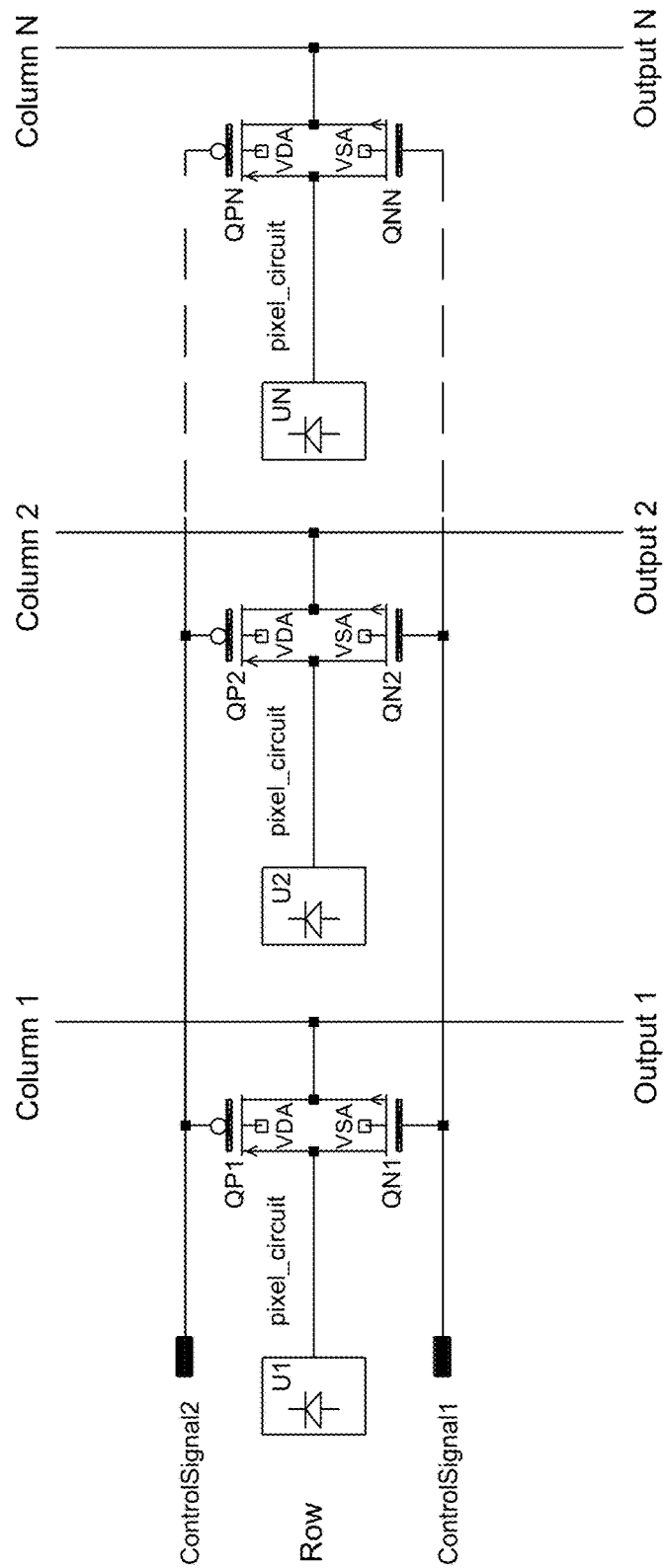
FIG. 9 illustrates a schematic diagram of an example row circuit for an imaging device.

FIG. 9 illustrates an example row circuit for an imaging matrix or array of an imaging device. Each column (e.g., Columns 1-N) is coupled to a pixel circuit (e.g., U1-UN that includes a photodiode) and provides an output (e.g., Output 1-N) for image data to be read from the pixel circuit. The pixel circuits are controlled by n-type MOSFETs (NMOS transistors) QN1, QN2, and QNN and p-type MOSFETs (PMOS transistors) QP1, QP2, and QPN. ControlSignal1 (CS1) is coupled to the gate of the NMOS transistors (switches) QN1, QN2, and QNN and ControlSignal2 (CS2) is coupled to the gate of the PMOS transistors (switches) QP1, QP2, and QPN. In proper operation, ControlSignal2 is the inverse of ControlSignal1.

The techniques, devices, and processes described herein can provide improvements in matrix type circuits, such as active matrix imagers where the row readout is controlled by row drivers that are daisy chained together and pass a token from one row driver to the next to initiate data readout of each line. A daisy chain is a wiring scheme in which multiple modules, circuits, or devices are wired together in sequence or in a ring (or a loop). For example, the token output of previous or prior row driver provides the input to the token input of a later or next row driver in a daisy chain or sequence. Using the techniques, devices, and processes described herein may allow for a few row drivers to be defective without generating a fatal defect to the whole chip, which can result in higher yields.

During the design phase of an IC, multiple row driver circuits are place in parallel for each row and the communal lines and output control signals and individual (non-communal) lines and output control signals are identified. For example, a truth table is built using the desired token status based on the different states of the communal and individual control signals. Using the truth table, a digital logic circuit (e.g., logic voting circuit or logic statement) is created to determine the correct state of the token at the input of the next row driver circuit. For example, if there are two communal control signals and the token signal, a two out of three (TOOT) voting scheme can be used to determine a correct token state at the next row driver. The logic circuit is positioned between the token output of a row driver and token input of a next row driver.

Table 1 provides a truth table for the row drivers shown in FIGS. 6 and 8 which can be used on the row circuit shown in FIG. 9. The bolded and underlined value shows the erroneous value.

TABLE 1

| Token_Out or Qin | ControlSignal1 | ControlSignal2 | Qout | Expected |
|---|---|---|---|---|
| 0 | 0 | 0 | 0 | Error in CS2 |
| 0 | 0 | 1 | 0 | Valid |
| 0 | 1 | 0 | 1 | Error in TO/Qin |
| 0 | 1 | 1 | 0 | Error in CS1 |
| 1 | 0 | 0 | 1 | Error in CS1 |
| 1 | 0 | 1 | 0 | Error in TO/Qin |

TABLE 1-continued

| Token_Out or Qin | ControlSignal1 | ControlSignal2 | Qout | Expected |
|---|---|---|---|---|
| 1 | 1 | 0 | 1 | Valid |
| 1 | 1 | 1 | 1 | Error in CS2 |

Figure 10:
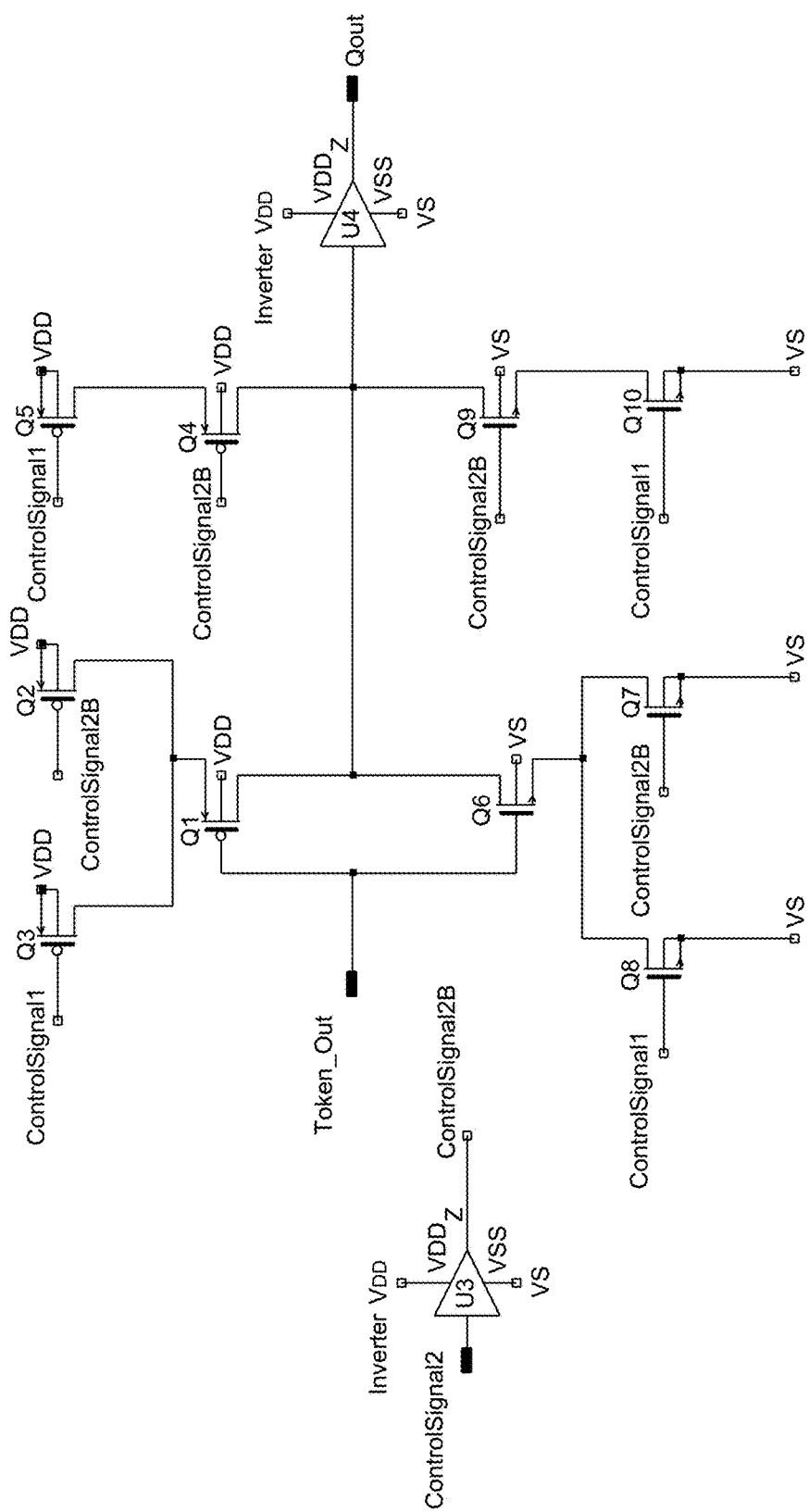
FIG. 10 illustrates a schematic diagram of an example digital logic voting circuit for three control lines.

FIG. 10 illustrates a circuit that implements the truth table shown in Table 1. U3 is an inverter to invert ControlSignal2 to ControlSignal2B (or second control signal bar) and U4 is an inverter to invert the output Qout. Q1-Q5 are PMOS transistors, and Q6-Q10 are NMOS transistors. FIG. 10 provide a 2 out of 3 (TOOT) voting scheme that uses to two out of the three values to determine a correct value instead of just relying on the token output which may be in error, as is used in conventional row driver connection without the logic voting circuit. Equation represented by Qout=CS1*CS2B+TO(CS1+CS2B) illustrates a formula for the truth table, where Qout represents the logic voting circuit output, CS1 is the ControlSignal1, CS2B is the inverse of ControlSignal2, TO is the Token_Out or token output, and Qin is logic voting circuit input. Although FIG. 9 provides one example circuit for the truth table shown in Table 1, other circuits may produce the same or similar results. In addition, other circuits may use additional inputs or outputs.

The logic voting circuit can determine a valid output based on a majority of congruent control signals relative to the predefined scheme (e.g., truth table). Congruent refers to signals that are in an agreement with each other according to a predefined scheme (e.g., a truth table). A truth table is a mathematical table used in logic—specifically in connection with Boolean algebra, boolean functions, and propositional calculus—to compute the functional values of logical expressions on each of their functional arguments, that is, on each combination of values taken by their logical variables. In particular, truth tables can be used to tell whether a propositional expression is true for all legitimate input values, that is, logically valid.

A truth table may also be generated for four control signal outputs of a row driver (not shown) and a three out of four (TOOF) scheme may be used or two out of four scheme (which is rare because it requires two erroneous signals to be generated) may be used with a specified control signal as a tie breaker.

Figure 11:
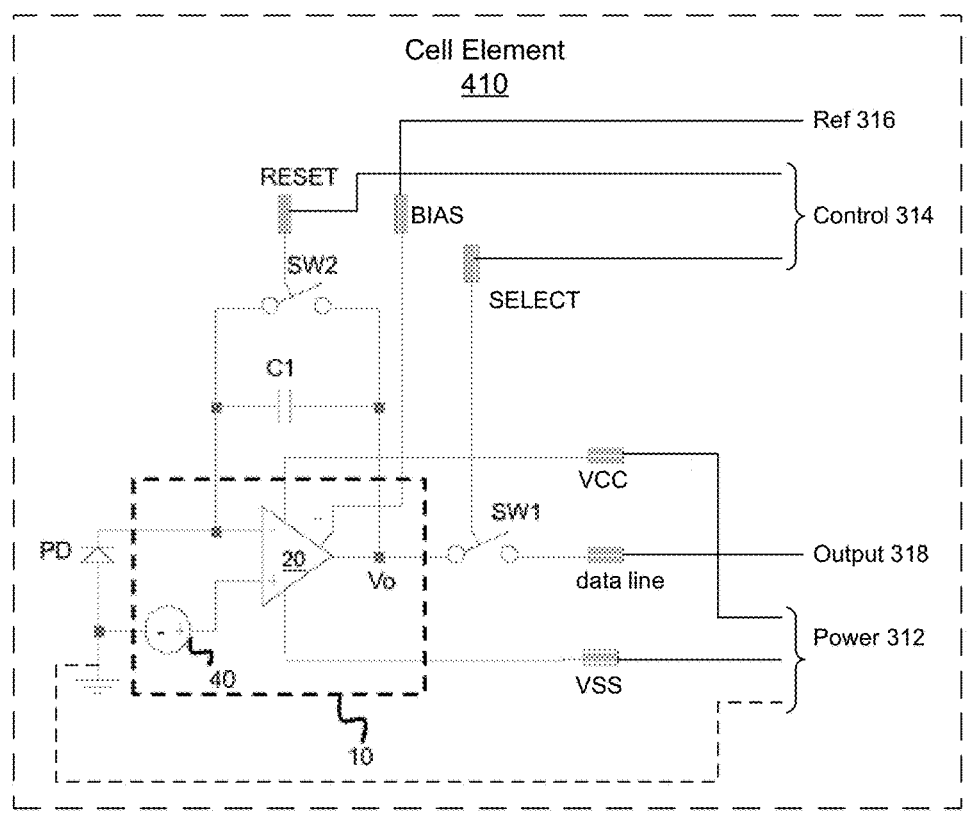
FIG. 11 illustrates a schematic diagram of an example imaging cell element for an array.

Each cell element in the array provides a similar function (e.g., pixel detector element, pixel display element, or memory element). International Publication No. WO2015038709 and U.S. Pat. No. 9,380,239 entitled, "Pixel Circuit with Constant Voltage Biased Photodiode and Related Imaging Method," which is incorporated by reference in its entirety, discloses an example pixel circuit or detector element for an imaging array or matrix that may be used as a cell element 210. FIG. 11 illustrates a cell element 410 that includes a pixel circuit or detector element for an imaging array or matrix. Each of the pixel circuits 410 includes a photo diode PD, a biasing circuit 10, a charge-to-voltage converter (capacitor) C1, and switches SW1 and SW2. The switches can be formed out of transistors. The photo diode converts photons into an electric charge or current. The biasing circuit 10 includes an operational amplifier (op amp) 20 and a voltage source 40. The pixel circuit may be configured to operate based on control signals 314 RESET and SELECT and a reference signal 316 BIAS. VCC, VSS, and GND provide voltages or power 312 to the op amp 20 and other components of the pixel circuit and data line provides an output 318. The communal lines of the row driver circuitry (e.g., ControlSignal1 and ControlSignal2) in FIGS. 6-10 can be coupled to at least one of the control signals 314 in FIGS. 11-12 and 14.

Figure 12:
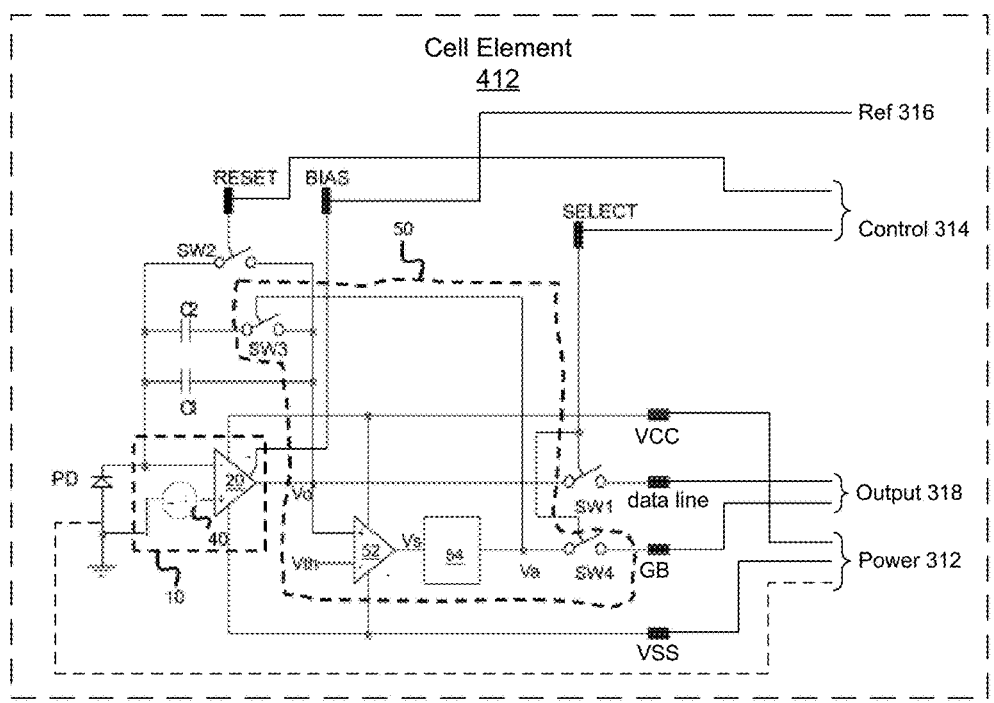
FIG. 12 illustrates a schematic diagram of another example imaging cell element for an array.

FIG. 12 illustrates another cell element 412 that includes a pixel circuit or detector element for an imaging array or matrix. Each of the pixel circuits 412 includes a photo diode PD, a biasing circuit 10, a gain-switching circuit 50, charge-to-voltage converters (capacitors) C1 and C2, and switches SW1 and SW2. The gain-switching circuit 50 includes a voltage comparator 52 (e.g., op amp) and a select circuit having a latch 54 and switches SW3 and SW4. The pixel circuit may be configured to operate based on control signals 314 RESET and SELECT and a reference signal 316 BIAS. VCC, VSS, and GND provide voltages or power 312 to the op amp 20, voltage comparator 52, latch 54, and other components of the pixel circuit. The data line and gain bit value (GB) provide outputs 318. A latch or flip-flop is a circuit that has two stable states and can be used to store state information.

Figure 13:
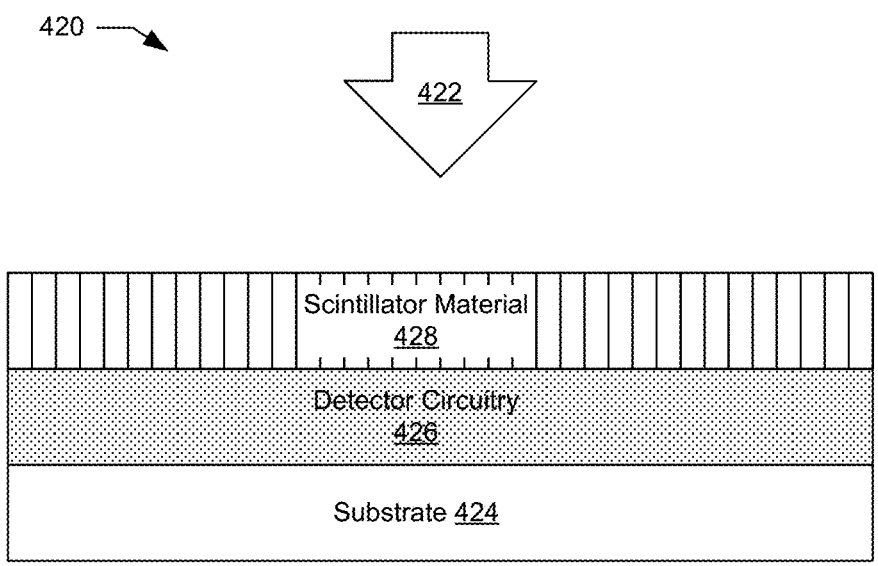
FIG. 13 illustrates a side view of layers in an example x-ray detector element in an x-ray detector array.

The pixel circuit or detector element may be used in an x-ray detector array or matrix (i.e., x-ray imager). An x-ray detector element (or detector element) refers to an element in a detector pixel that converts x-ray photons to electrical charges. A detector element may include a photoconductor material which can convert x-ray photons directly to electrical charges (electron-hole pairs) in a direct detection scheme. Suitable photoconductor material include and are not limited to mercuric iodide ($HgI_2$), lead iodide ($PbI_2$), bismuth iodide ($BiI_3$), cadmium zinc telluride (CdZnTe), or amorphous selenium (a-Se). In some embodiments, a detector element may comprise a scintillator material which converts x-ray photons to light and a photosensitive element coupled to the scintillator material to convert the light to electrical charges (i.e., indirect detection scheme), as illustrated in FIG. 13. FIG. 13 illustrates a radiation source 422 relative to the layers of an x-ray detector element 420 using the indirect detection scheme, which includes a substrate 424, photosensitive element and detector circuitry 426, and a layer of scintillator material 428. The x-ray detector element 420 may include other layers, sections shown may include multiple layers (e.g., detector circuitry 426 includes multiple processing layers), or the layers may be in a different order. Suitable scintillator materials include and are not limited to gadolinium oxisulfide ($Gd_2O_2S$:Tb), cadmium tungstate ($CdWO_4$), bismuth germanate ($Bi_4Ge_3O_{12}$ or BGO), cesium iodide (CsI), or cesium iodide thallium (CsI:Tl)). Suitable photosensitive element may include a photodiode, a photogate, or phototransistors.

Other circuitry for pixel circuits or detector elements representing cell elements may also be used. The cell elements may also represent a pixel display element (not shown) used in a display array to emit light (instead of detect light) from light emitting diodes (LEDs).

Figure 14:
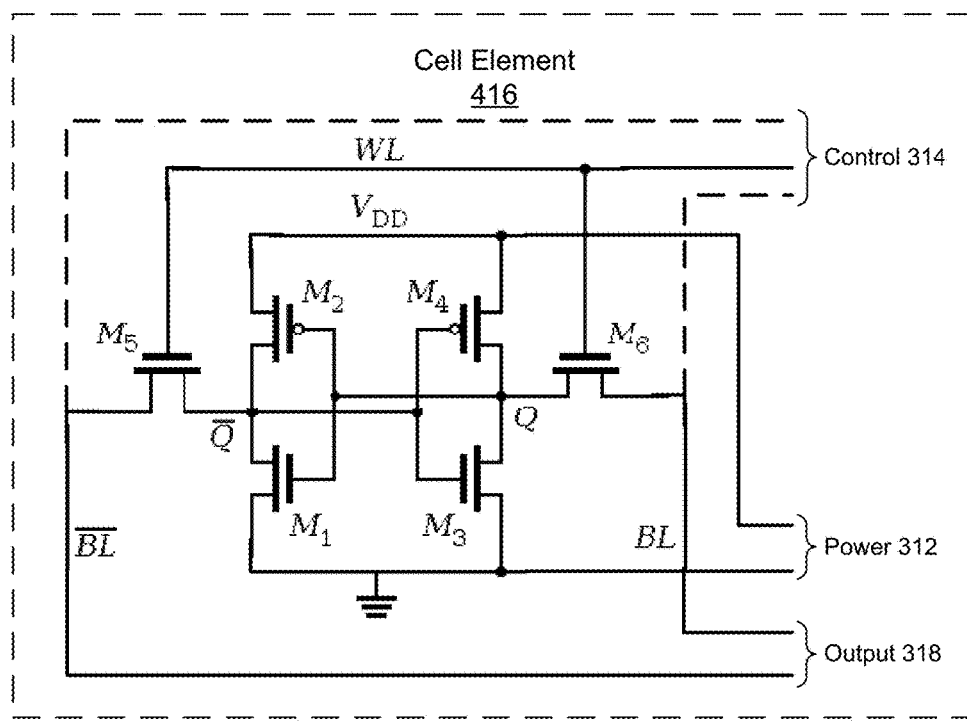
FIG. 14 illustrates a schematic diagram of an example six transistor static random-access memory (SRAM) cell element for an array.

FIG. 14 illustrates a cell element 416 that includes a memory element for a static random-access memory (SRAM) array or matrix. The memory element 416 includes six transistors (M1, M2, M3, M4, M5, and M6. Transistors M1, M2, M3, and M4 store the bit and transistors M5 and M6 couples the memory element to the bit line BL, which acts as an input for writes and an output for reads. VDD and GND provide voltages or power 312 to transistors M1, M2, M3, and M4. The memory element is configured to operate based on control signals 314 word line WL and bit line BL and inverse of bit line $\overline{BL}$ for writes and word line WL for reads. On reads, BL and $\overline{BL}$ provide outputs 318. Even though SRAM is shown, other memory elements, such as flash memory and dynamic random-access memory (DRAM), may similarly be configured.

FIGS. 11-12 and 14 provide different types of cell elements that may be used in matrix type ICs. The embodiments disclosed may also have application to other types of ICs with cell elements in a matrix or 2D array.

Figure 15:
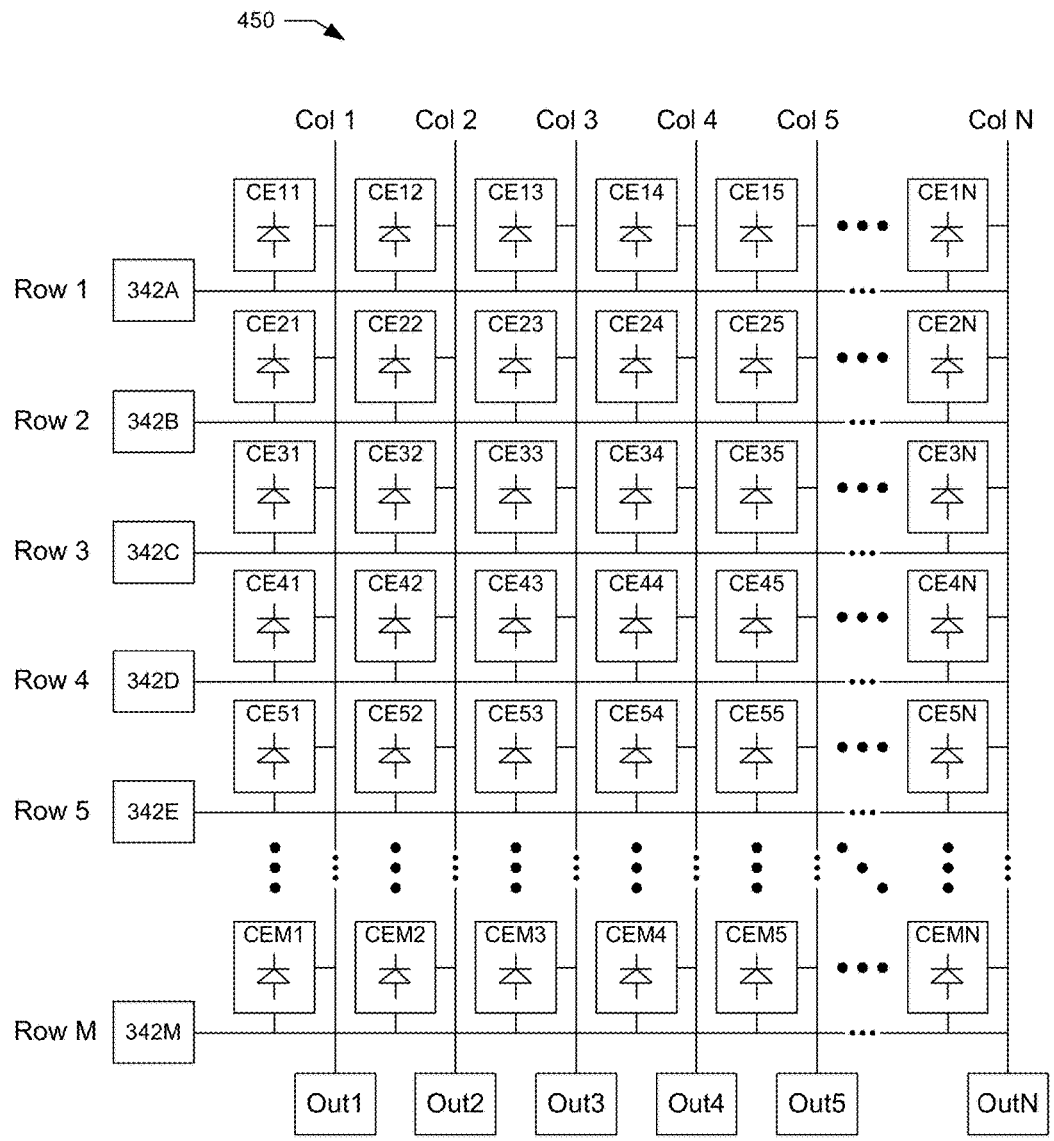
FIG. 15 illustrates a schematic diagram of an example two dimensional (2D) array of cell elements with row driver logic.

FIG. 15 illustrates a M row by N column 2D array of cell elements 450 with row driver logic 342A-M. The cell elements CE11-CEMN can include pixel detector elements (as shown in FIGS. 11-12), pixel image elements, pixel display elements, or memory elements (as shown in FIG. 14). Each row has a row driver logic 342A-M. Each column has output or input circuitry (e.g., Out1-OutN) to read values from or write values to each column. For pixel detector elements or pixel image elements, the output or input circuitry can include read or sense circuitry to read the values from each column. For pixel display elements or pixel image elements, the output or input circuitry can include write circuitry to drive signals to each column. For memory elements, the output or input circuitry can include both read and write circuitry to both read from each column and drive signals to each column.

In another embodiment, a matrix type integrated circuit includes a row driver module 350 or 352 and a two dimensional (2D) array of cell elements 450 arranged in vertical columns and horizontal rows. Each cell element CE11-CEMN in the 2D array provides a similar function (e.g., pixel detector element, pixel image element, pixel display element, or memory element). The row driver module includes at least two row drivers 360A and 360P and a voting logic module 370A. The at least two row drivers are configured to generate control signals on at least two communal lines 362A and 362K for cell elements of at least one row of the 2D array, wherein each row driver is configured to generate control signals on at least three control lines 362A, 362K, and 372, and at least two control lines of the at least two row drivers are the communal lines, and each communal line is coupled to a corresponding communal line of another row driver of the at least two row drivers. The voting logic module coupled to the at least three control lines of one of the row drivers and configured to generate an output based on the control signals on the at least three control lines.

In an example, the matrix integrated circuit is a complementary metal-oxide-semiconductor (CMOS) image sensor and each cell element includes a photodiode for a pixel. The CMOS image sensor can be an X-ray image sensor that includes a scintillator layer that coverts radiation into light photons for the photodiodes. In another example, the matrix integrated circuit is an x-ray image sensor and each cell element includes a photoconductor material which can convert x-ray radiation or x-ray photons directly to electrical charges in a direct detection scheme.

In another example, one control line of the at least three control lines is a non-communal line 372 coupling one of the at least two drivers 360A of the row driver module 352 to the voting logic module 370A. Each row driver includes at least one token control input configured to receive a previous control signal to enable the operation of the row driver, and at least one token control output configured to generate a next control signal for passing control to a next row driver in a sequence.

In another example, the matrix type integrated circuit further includes a plurality of row driver modules. Each row driver module is coupled to a next row driver module in a sequence or a daisy chain, and the output of the voting logic module is coupled to an input of a row driver of the next row driver module. Each driver module can generate the control signals on communal lines for cell elements in a distinguishable group of rows, and the each distinguishable group of rows includes at least one row of cell elements. For example, the distinguishable group of rows can be a subset of the rows of the matrix type integrated circuit.

In another example, the voting logic module compares the control signals on the at least three control lines and generates an output based on a majority of congruent control signals. The voting logic module can include a two out of three (TOOT) voting circuit, a three out of four (TOOF) voting circuit, or a two out of four voting circuit.

In another example, each row driver module includes at least three row drivers, and a majority of row drivers generate valid control signals for the cell elements and overcome at least one erroneous control signal from a defective row driver. Each communal line couples an output of the row drivers in the row driver module in parallel.

In another example, the matrix type integrated circuit includes at least a thousand (1000) row drivers. In another example, a continuous area of the matrix type integrated circuit extends over a reticle boundary. A continuous area of the matrix type integrated circuit can be greater than 25 square centimeters (cm2).

Figure 16:
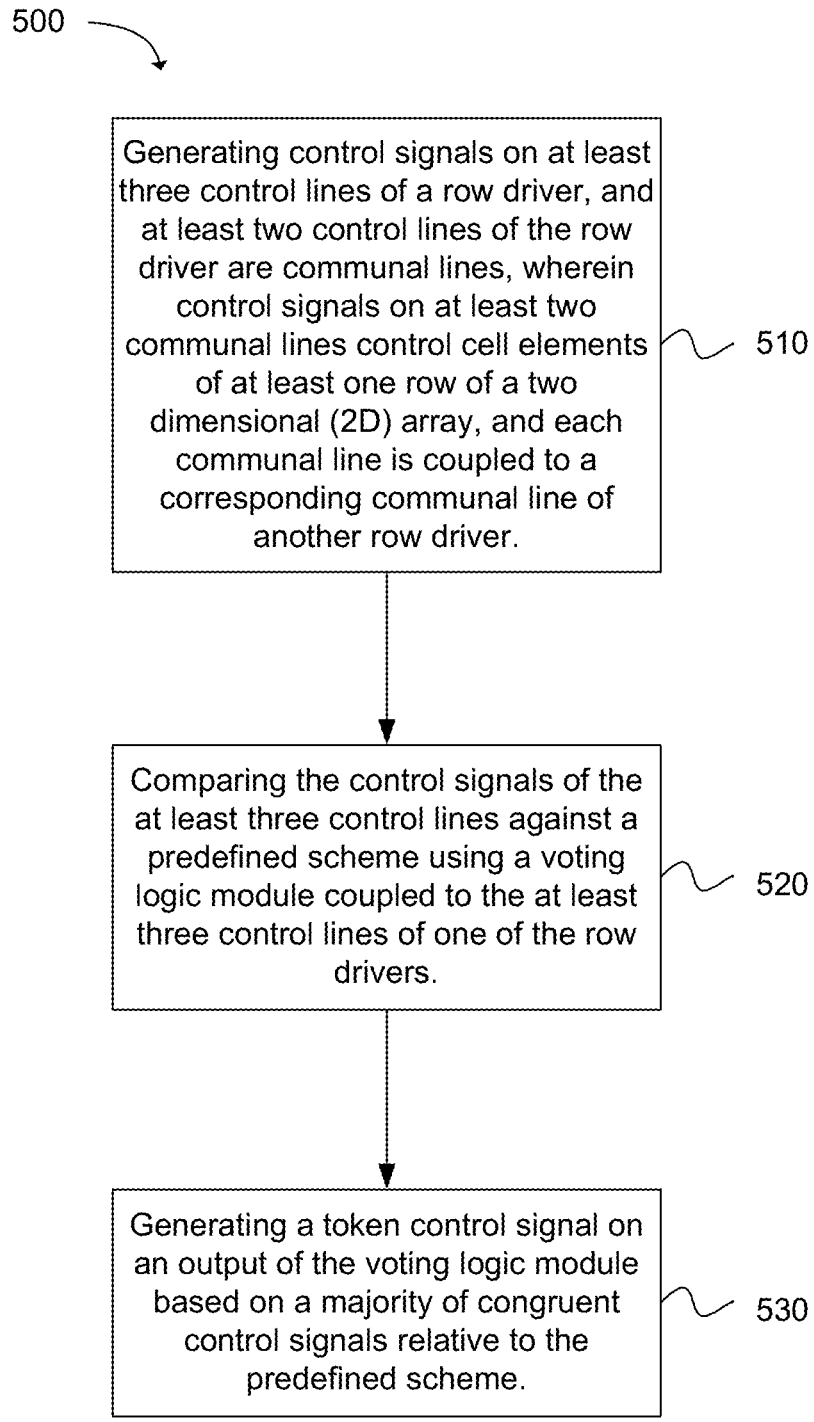
FIG. 16 is flowchart illustrating an example of a method for generating a valid token control signal from control signals on at least three control lines of a row driver in a matrix type integrated circuit.

The flowchart shown in FIG. 16 illustrates a method 500 for generating a valid token control signal from control signals on at least three control lines of a row driver in a matrix type integrated circuit. In an example, the method may be executed as instructions on a machine or computer circuitry, where the instructions are included on at least one computer readable medium or at least one non-transitory machine readable storage medium. The method includes the step of generating control signals on at least three control lines of a row driver, and at least two control lines of the row driver are communal lines, wherein control signals on at least two communal lines control cell elements of at least one row of a two dimensional (2D) array, and each communal line is coupled to a corresponding communal line of another row driver, as in step 510. The step of comparing the control signals of the at least three control lines against a predefined scheme using a voting logic module coupled to the at least three control lines of one of the row drivers follows, as in step 520. The next step of the method includes generating a token control signal on an output of the voting logic module based on a majority of congruent control signals relative to the predefined scheme, as in step 530. In another example, the predefined scheme can be represented by a truth table.

In another example, the method can further include propagating the token control signal to a row driver in a next row driver module, activating the row driver in the next row driver module, and generating control signals on at least three control lines of the row driver in the next row driver module.

In another example, the method can further include generating (or receiving) a faulty or erroneous control signal on one of the communal lines by the row driver, and generating a valid control signal on the communal line with the faulty or erroneous control signal using at least two other row drivers. The valid control signal overrides the faulty or erroneous control signal. The method can further include controlling the cell elements of the at least one row of the 2D array with the valid control signal.

Circuitry can include hardware, firmware, program code, executable code, computer instructions, and/or software. A non-transitory computer readable storage medium can be a computer readable storage medium that does not include a signal.

It should be understood that many of the functional units described in this specification have been labeled as modules, in order to more particularly emphasize their implementation independence. For example, a module may be implemented as a hardware circuit comprising custom very-large-scale integration (VLSI) circuits or gate arrays, including but not limited to logic chips, transistors, or other components. A module may also be implemented in programmable hardware devices, including but not limited to field programmable gate arrays (FPGA), programmable array logic, programmable logic devices or similar devices.

Reference throughout this specification to an "example" or an "embodiment" means that a particular feature, structure, or characteristic described in connection with the example is included in at least one embodiment of the invention. Thus, appearances of the words an "example" or an "embodiment" in various places throughout this specification are not necessarily all referring to the same embodiment.

Furthermore, the described features, structures, or characteristics may be combined in a suitable manner in one or more embodiments. In the following description, numerous specific details are provided (e.g., examples of layouts and designs) to provide a thorough understanding of embodiments of the invention. One skilled in the relevant art will recognize, however, that the invention can be practiced without one or more of the specific details, or with other methods, components, layouts, etc. In other instances, well-known structures, components, or operations are not shown or described in detail to avoid obscuring aspects of the invention.

While the forgoing examples are illustrative of the principles of the invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited. Various features and advantages of the invention are set forth in the following claims.

What is claimed is:

1. A matrix type integrated circuit, comprising:
   a two dimensional (2D) array of cell elements arranged in vertical columns and horizontal rows, wherein each cell element provides a similar function; and
   a row driver module including:
      at least two row drivers configured to generate control signals on at least two communal lines for cell elements of at least one row of the 2D array, wherein each row driver is configured to generate control signals on at least three control lines, and at least two control lines of the at least two row drivers are the communal lines, and each communal line is coupled to a corresponding communal line of another row driver of the at least two row drivers; and
      a voting logic module coupled to the at least three control lines of one of the row drivers and configured to generate an output based on the control signals on the at least three control lines.

2. The matrix type integrated circuit of claim 1, wherein one control line of the at least three control lines is a non-communal line coupling one of the at least two drivers of the row driver module to the voting logic module.

3. The matrix type integrated circuit of claim 1, wherein each row driver includes:
- a token control input configured to receive a previous control signal to enable an operation of the row driver; and
- a token control output configured to generate a next control signal for passing control to a next row driver in a sequence.

4. The matrix type integrated circuit of claim 1, further comprising:
- a plurality of row driver modules, wherein each row driver module is coupled to a next row driver module in a sequence or a daisy chain, and the output of the voting logic module is coupled to an input of a row driver of the next row driver module.

5. The matrix type integrated circuit of claim 4, wherein each driver module generates the control signals on communal lines for cell elements in a distinguishable group of rows, and the each distinguishable group of rows includes at least one row of cell elements.

6. The matrix type integrated circuit of claim 1, wherein the voting logic module compares the control signals on the at least three control lines and generates an output based on a majority of congruent control signals.

7. The matrix type integrated circuit of claim 1, wherein the voting logic module includes a two out of three (TOOT) voting circuit.

8. The matrix type integrated circuit of claim 1, wherein the voting logic module includes a complementary metal-oxide-semiconductor (CMOS) circuit.

9. The matrix type integrated circuit of claim 1, wherein the matrix integrated circuit is a complementary metal-oxide-semiconductor (CMOS) image sensor and each cell element includes a photodiode for a pixel.

10. The matrix type integrated circuit of claim 9, wherein the CMOS image sensor is an X-ray image sensor that includes a scintillator layer that coverts radiation into light photons for the photodiodes.

11. The matrix type integrated circuit of claim 1, wherein each row driver module includes at least three row drivers, and a majority of row drivers generate valid control signals for the cell elements and overcome at least one erroneous control signal from a defective row driver.

12. The matrix type integrated circuit of claim 1, wherein the each communal line couples an output of the at least two row drivers in the row driver module in parallel.

13. The matrix type integrated circuit of claim 1, wherein matrix type integrated circuit includes at least 1000 row drivers.

14. The matrix type integrated circuit of claim 1, wherein a continuous area of the matrix type integrated circuit extends over a reticle boundary.

15. The matrix type integrated circuit of claim 1, wherein a continuous area of the matrix type integrated circuit is greater than 25 square centimeters ($cm^2$).

16. A method for generating a valid token control signal from control signals on at least three control lines of a row driver in a matrix type integrated circuit, the method comprising:
- generating control signals on at least three control lines of the row driver, and at least two control lines of the row driver are communal lines, wherein control signals on at least two communal lines control cell elements of at least one row of a two dimensional (2D) array, and each communal line is coupled to a corresponding communal line of another row driver;
- comparing the control signals of the at least three control lines against a predefined scheme using a voting logic module coupled to the at least three control lines of one of the row drivers; and
- generating a token control signal on an output of the voting logic module based on a majority of congruent control signals relative to the predefined scheme.

17. The method of claim 16, wherein the predefined scheme can be represented by a truth table.

18. The method of claim 16, further comprising:
- propagating the token control signal to a row driver in a next row driver module;
- activating the row driver in the next row driver module; and
- generating control signals on at least three control lines of the row driver in the next row driver module.

19. The method of claim 16, further comprising:
- generating a faulty or erroneous control signal on one of the communal lines by the row driver; and
- generating a valid control signal on the communal line with the faulty or erroneous control signal using at least two other row drivers, wherein the valid control signal overrides the faulty or erroneous control signal.

20. The method of claim 19, further comprising:
- controlling the cell elements of the at least one row of the 2D array with the valid control signal.

* * * * *